United States Patent [19]

Coates et al.

[11] Patent Number: 4,596,929
[45] Date of Patent: Jun. 24, 1986

[54] THREE-STAGE SECONDARY EMISSION ELECTRON DETECTION IN ELECTRON MICROSCOPES

[75] Inventors: Vincent J. Coates, Palo Alto; Duane C. Holmes, San Jose; Guillermo L. Toro-Lira, Mountain View, all of Calif.

[73] Assignee: Nanometrics Incorporated, Sunnyvale, Calif.

[21] Appl. No.: 553,533

[22] Filed: Nov. 21, 1983

[51] Int. Cl.[4] ............................................ G01N 23/00
[52] U.S. Cl. ..................................... 250/310; 250/397
[58] Field of Search ................ 250/310, 311, 305, 397

[56] References Cited

U.S. PATENT DOCUMENTS

| | | | |
|---|---|---|---|
| 3,474,245 | 10/1969 | Kimura et al. | 250/397 |
| 3,678,384 | 7/1972 | Oatley | 250/310 |
| 4,355,232 | 10/1982 | Todokoro et al. | 250/310 |
| 4,442,355 | 4/1984 | Tamura et al. | 250/310 |

Primary Examiner—Bruce C. Anderson
Attorney, Agent, or Firm—Linval B. Castle

[57] ABSTRACT

In scanning electron microscopes the field established between the focusing lens housing at ground potential and the secondary emission electron detector at a positive potential attracts and carries the secondary electrons to the detector. This field is often displaced from the secondary emission source so that much of the emission is attracted to other areas of the microscope and is lost to the detector. To greatly improve detection efficiency, an electron attracting grid at a potential between that on the detector and the focusing lens housing ground reference potential is interposed between the detector and the specimen and positioned so that the new field established between grid and lens housing dips down toward the specimen surface and thus collects substantially all of the secondary emission electrons which then are attracted to higher potential on the detector.

4 Claims, 3 Drawing Figures

THREE-STAGE SECONDARY EMISSION ELECTRON DETECTION IN ELECTRON MICROSCOPES

CROSS REFERENCE TO RELATED APPLICATIONS

The invention disclosed herein is related to U.S. application Ser. No. 497,516, filed May 24, 1983, which describes and claims a scanning electron microscope conical lens such as shown in this application.

BRIEF SUMMARY OF THE INVENTION

This invention relates generally to electron microscopes and in particular to a novel grid assembly having a potential that greatly improves the detection of secondary electron emission in scanning electron microscopes.

In scanning electron microscopes, an accelerated beam of electrons is sharply focused upon the surface of a specimen and secondary electron emission produced by such bombardment is detected to generate a corresponding output signal. This resulting signal is coordinated with the current excitation signals applied to deflection means in the electron beam to produce video output signals which may be used to view and/or produce a photograph of that part of the specimen surface being bombarded by the beam.

Secondary emission from a bombarded specimen surface consists of low energy electrons that must be "gathered" and accelerated to the detector. Therefore, it is the usual practice to place, between the impinged specimen surface and the detector, a grid or screen at a relatively low potential of perhaps +300 volts. This potential produces, between the grid and the grounded shell of the focusing lens, a field which will draw the secondary electrons toward the detector. After passing the grid, the stream of secondary electrons is accelerated into the detector by a relatively high potential of perhaps +10 kilovolts on the detecting surface.

As discussed in detail in our copending patent application, Ser. No. 497,516 of May 24, 1983, it is very often necessary to tilt the specimen supporting stage in the microscope so that specimen edges may be inspected to determine various strata, undercutting, dimensioning, etc. Thus, the copending application describes a conical focusing lens that permits the edges of large specimen to be positioned at the focal point of the bombarding electron beam, but at an increased focal distance from the end of the focusing lens assembly. This increased focal distance places the source of the secondary electrons further from the field between the low potential grid and the detector. Therefore, fewer secondary electrons are attracted to the grid and then to the detector, and this results in a significant loss in detection efficiency.

This invention is for a second screen or grid at a potential somewhat lower than that applied to the first grid and positioned adjacent and substantially parallel with the end of the grounded housing of the focusing lens assembly and between the specimen and the first grid and detector. The potential on this second grid generates between the grid and the bottom the lens housing a field that extends down very close to the specimen and therefore attracts substantially all secondary electrons emitted from the bombarded specimen. The first grid at a higher positive potential then draws in the electrons and the very high potential on the detector completes the detection. Thus, detection efficiency is greatly improved and strong output signals are available from the detector.

It is well known that secondary emission potential depends upon the type of material in the specimen and all general purpose scanning electron microscopes have heretofore required an electrically conductive specimen surface, such as a evaporated film of palladium or the like, in order to prevent a charge build-up that will occur on nonconductive surfaces and which will operate to repel the incoming electron beam. A reduced bombardment energy resulting from a repelled electron beam will reduce the secondary emission field to the detection system and produce poor detection efficiency. The use of the second grid described herein overcomes this problem and permits the efficient electron microscope inspection of nonconductive specimens such as electronic semiconductor components, organic specimens, etc., since virtually all secondary electrons emitted as a result of the electron bombardment are gathered by the second grid and are directed to the first or higher potential grid to be accelerated further by the very high potential on the detector. Thus, by employing a three stage system comprising a low potential second grid, a higher potential first grid, and a high potential detector, a highly efficient detection system results for the scanning electron microscope inspection of either conductive or nonconductive specimens.

BRIEF DESCRIPTION OF THE DRAWINGS

In the drawings which illustrate the preferred embodiment of the invention.

DETAILED DESCRIPTION

Figure 1:
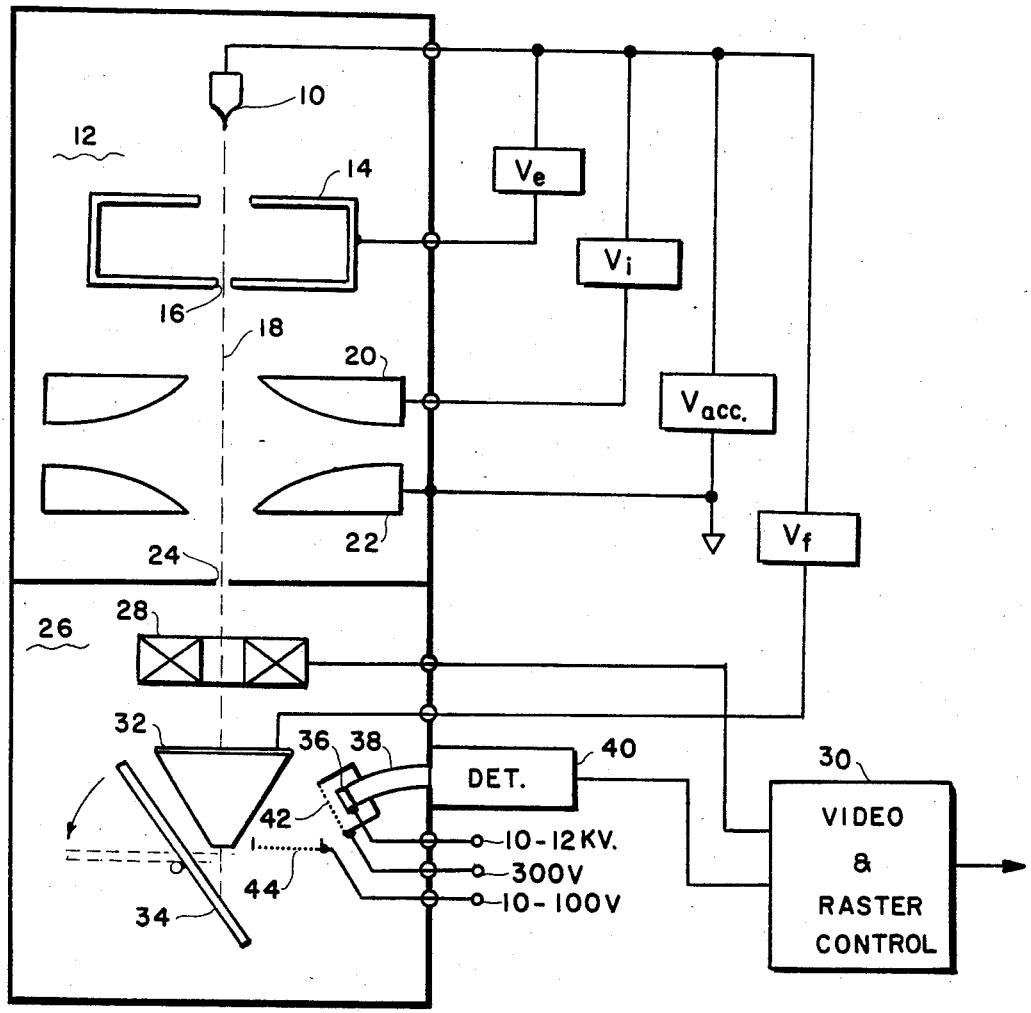
FIG. 1 is a sectional elevational drawing illustrating a typical scanning electron microscopy employing the three-stage secondary emission detection system.

The invention to be described herein may be incorporated into various types of scanning electron microscopes (hereinafter referred to as SEM) such as thermionic emission SEMs having a heated emitter, or field emission SEMs such as that illustrated in the schematic drawing of FIG. 1. In the field emission SEM a pointed emitter 10 in a high vacuum chamber 12 is held at a negative potential of about 5 KV with respect to an extractor anode 14 which has a small beamdefining aperture 16 with a diameter of approximately 50 microns. The narrow electron beam 18 is then collimated by an electrostatic field between anodes 20 and 22 and is passed through a small aperture which forms a vacuum isolation gate 24 between the high vacuum chamber 12 and a lower vacuum specimen chamber 26.

The electron beam 18 now passes through the center of X-Y deflection coils 28 which are energized with current generated and controlled by a video and raster control circuit 30 and the beam then enters the bore of a focusing lens 32 which, in the preferred embodiment, has a conical envelope permitting close examination of profiles or edges of specimens mounted on a tiltable stage 34. The focused electron beam 18 upon bombarding the specimen will produce secondary emission electrons which are detected by an electron detector such as an aluminized scintillator button 36 coupled to a fiber optic bundle or a light pipe 38 and detector circuit 40. Scintillators such as the scintillator button 36 must be operated at voltages of about +10 KV and while such a high voltage will certainly attract virtually all secondary emission electrons from the specimen, it also affects the electron beam 18 and causes it to deflect toward the scintillator and away from the desired focal point on the specimen. Therefore, it is the usual practice to shield the high potential scintillator with a low voltage grid such as the grid 42 which is held at a potential in the order of about 300 volts. Thus, the secondary emission electrons are first drawn to the low voltage grid 42 by the +300 volt potential, and upon entering the grid are accelerated to the scintillator 36 by its +10 to 12 KV potential. The detected electrons are thus converted by the scintillator 36 into corresponding optical photons that are transmitted through the light pipe 38 to the detector 40 which generates corresponding output signals to the video section of the control circuitry 30. This circuitry then generates video output signals that are synchronized with the current signals applied to the X-Y excitation coils 28.

Figure 2:
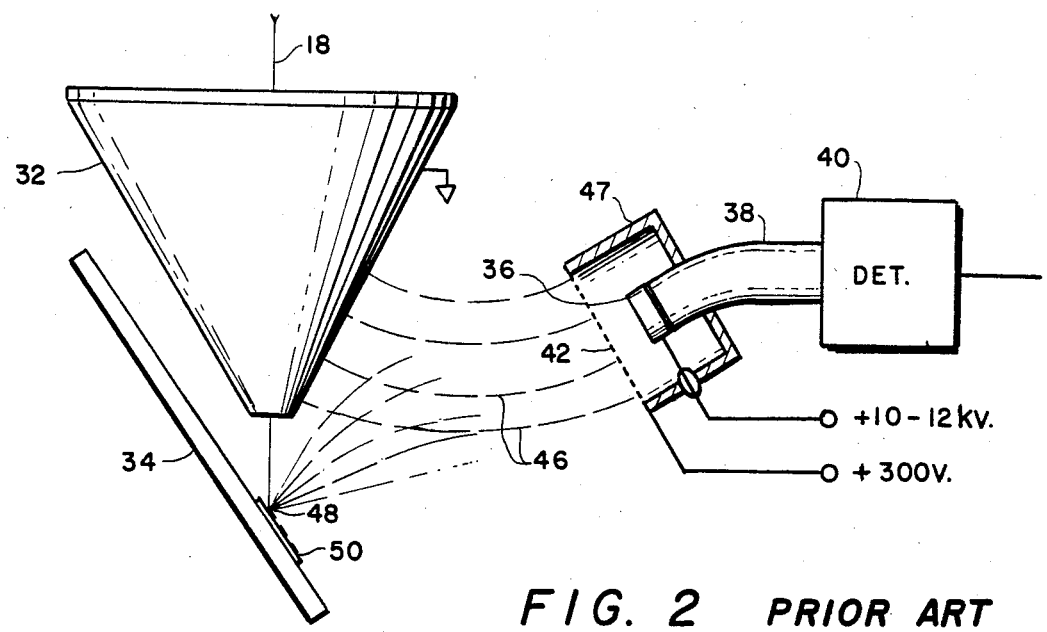
FIG. 2 is an enlarged view of the focusing lens and detector portions of a prior art scanning electron microscope illustrating the various fields being generated.

FIG. 2 is a schematic drawings in greater detail illustrating the focusing lens 32, the substrate stage 34, and detection components 36–42 of only that part of the preferred embodiment described above illustrates the problems that are eliminated by the invention.

Returning now to the description of FIG. 1, it has been found that a great improvement in detection efficiency results by the insertion of a second grid 44 between the first grid 42 and the focusing point of the electron beam 18 on the specimen. The second grid 44 is preferably positioned in a substantially horizontal plane and even with, or sligthly above, the lower surface of thefocusing lens 32. As shown in FIG. 1, a potential of between 10 and 100 volts is applied to the second grid 44.

FIG. 2 is a detailed schematic view of that portion of a typical field emission SEM including the focusing coil 32, specimen stage, and detection components 36–42 as described above in connection with FIG. 1. An electrostatic field, represented by the dashed lines 46, is produced between the grounded housing of the focusing lens 32 and the grid 42 and its conductive housing 42 at an approximate 300 volt potential and functions as path to the grid 42 and scintillator 36 for the secondary emission electrons. It will be noted that because of proximity of the grid 42 and its conductive housing 47 to the grounded housing of the focusing lens 32, the field established between them can be quite wide and at a considerable distance from the source of the secondary emission. Because of this long path from the specimen to the field, a substantial quantity of secondary emission electrons stray and are attracted to various other components such as the grid housing 47. This results in fewer electrons at the scintillator 36 and a reduction in detection efficiency.

Figure 3:
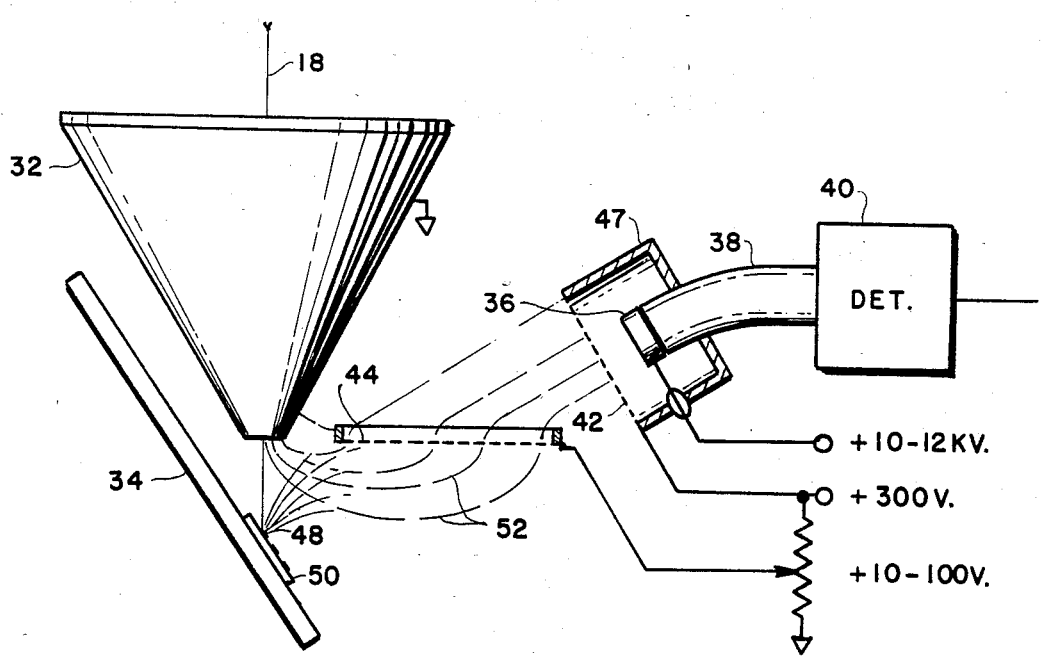
FIG. 3 is an enlarged view of the focusing lens and detector portions of a scanning electron microscopy employing the three-stage secondary emission detection system of the invention.

FIG. 3 is a schematic drawing illustrating the results of the addition of the second grid 44 between the first grid 42 and the focal point 48 of the electron beam 18 on the specimen 50. The second grid 44 is positioned in a plane substantially perpendicular to the axis of the electron beam 18 and should be adjacent the apex or lower end of the grounded housing of the focusing lens 32, or within approximately five millimeters above that position. A potential that may be varied between approximately 10 to 100 volts is applied to the second grid 44 and a field pattern represented by the dashed lines 52 is thus formed between the second grid and the lower end of the grounded housing of the focusing lens 32. It is be to noted that this field pattern is confined to only that area below the apex of the lens 32 and the grid 44, and is forced into the area very close to the focal point 48 on the specimen 50. Because of the proximity of the field, virtually all of the secondary emission electrons produced by the bombardment of the electron beam 18 onto the specimen will enter the field and will be carried to the second grid 44, the first grid 42, and the scintillator 36. This results in a detection efficiency that is improved to the point where nonconductive specimens which normally produce a relatively low secondary emission may very easily be examined by conventional or television camera at conventional raster speeds.

Having thus described our invention, what is claimed is:

1. An electron microscope having electron beam adjusting means at a reference potential, a specimen downstream of said adjusting means, and detecting means including a shielding grid at a first positive potential higher than said reference potential for attracting secondary emission electrons emitted from said specimen by bombardment by the electron beam and further including scintillator means behind said shielding grid and at a high second positive potential for detecting said secondary emission electrons, the improvement comprising:

a first grid interposed between said detecting means and said substrate, said first grid being at a positive potential between said first positive potential and said reference potential and positioned to deflect electrostatic fields between the beam adjusting means and said detecting means into paths closer to the specimen.

2. The electron microscope claimed in claim 1 wherein said electron beam adjusting means is a conical shaped focusing lens with apex facing said specimen, said specimen being mounted upon a stage tiltable to be substantially parallel with the conical wall of said focusing lens whereby edges of said specimen may be bombarded by said electron beam.

3. The electron microscope claimed in claim 1 wherein said microscope is a scanning electron microscope having an electron emitter for emitting a beam of electrons, X-Y deflection coils downstream of said emitter for deflecting said electron beam, and a conical shaped focusing lens downstream of said deflection coils for focusing said beam on a specimen mounted upon a stage tiltable to an angle wherein said stage is substantially parallel with the wall of said conical focusing lens for microscopic examination of edges of the specimen.

4. The electron microscope claimed in claim 3 wherein said microscope is a field emission scanning electron microscope having an electron emitter is a high vacuum portion of said microscope and at a high negative potential with respect to said reference potential.

* * * * *